United States Patent
Liu et al.

(10) Patent No.: US 12,513,846 B2
(45) Date of Patent: Dec. 30, 2025

(54) EASILY MOUNTABLE DEVICE BRACKET ASSEMBLY

(71) Applicant: Alpha Networks Inc., Hsinchu (TW)

(72) Inventors: Shao-Kang Liu, Hsinchu (TW); Chih-Kuang Wang, Hsinchu (TW)

(73) Assignee: Alpha Networks Inc., Hsinchu (TW)

( * ) Notice: Subject to any disclaimer, the term of this patent is extended or adjusted under 35 U.S.C. 154(b) by 275 days.

(21) Appl. No.: 18/222,398

(22) Filed: Jul. 14, 2023

(65) Prior Publication Data
US 2024/0324135 A1    Sep. 26, 2024

(30) Foreign Application Priority Data

Mar. 23, 2023 (TW) .................. 112110932

(51) Int. Cl.
*H05K 7/14* (2006.01)
*H05K 7/18* (2006.01)

(52) U.S. Cl.
CPC ........... *H05K 7/1489* (2013.01); *H05K 7/186* (2013.01)

(58) Field of Classification Search
None
See application file for complete search history.

(56) References Cited

U.S. PATENT DOCUMENTS

| | | | | |
|---|---|---|---|---|
| 6,739,682 B2 * | 5/2004 | Shih | ...................... | H05K 7/1421 312/334.4 |
| 2004/0227441 A1 * | 11/2004 | Wang | ...................... | A47B 88/49 312/334.8 |
| 2012/0145874 A1 * | 6/2012 | Eberle, Jr. | ............ | H05K 7/1491 248/224.7 |
| 2017/0164507 A1 * | 6/2017 | Liao | ...................... | H05K 7/1489 |
| 2019/0059585 A1 * | 2/2019 | Chen | ...................... | A47B 88/43 |

FOREIGN PATENT DOCUMENTS

| | | |
|---|---|---|
| CN | 2624588 | 7/2004 |
| CN | 109874247 | 6/2020 |
| CN | 111263559 | 6/2020 |
| TW | I266584 B | 11/2006 |
| TW | I548329 B | 9/2016 |
| TW | I717689 B | 2/2021 |

\* cited by examiner

*Primary Examiner* — Allen L Parker
*Assistant Examiner* — Christopher L Augustin
(74) *Attorney, Agent, or Firm* — CIPO IP Group

(57) ABSTRACT

An easily mountable device bracket assembly includes a first bracket having a side that can be provided with at least one mounting member, a second bracket, and a third bracket having a side that can be fixed to a device housing and at least one bent portion having an inner wall spaced apart from an outer wall of the third bracket to form a slide groove. At least one gap formed by the mounting member and the side of the first bracket forms another slide groove. The second bracket can extend into the another slide groove in a connecting direction to be connected with the first bracket. When the device mounted with the third bracket is placed into an open rack or rack-type cabinet, the slide groove is in contact with the first bracket, and the third bracket is connected to the first bracket slidingly along the connecting direction.

9 Claims, 8 Drawing Sheets

EASILY MOUNTABLE DEVICE BRACKET ASSEMBLY

CROSS-REFERENCE TO RELATED PATENT APPLICATION

This non-provisional application claims priority to and the benefit of, under 35 U.S.C. § 119(a), Taiwan Patent Application No. 112110932, filed Mar. 23, 2023 in Taiwan. The entire content of the above identified application is incorporated herein by reference.

FIELD

The present disclosure relates to a device bracket assembly, and more particularly to a bracket assembly that is easily mountable to a device.

BACKGROUND

Conventional networking equipment such as a network switch has a certain volume and weight because it is generally made of sheet metal and includes a circuit board and heat sinks, among other components. When installing such a device, therefore, it takes a lot of physical effort to mount the device on an open rack or in a rack-type cabinet, and it is equally physically demanding to remove the device from the open rack or rack-type cabinet. If the mounting or removing operation is to be performed by a single person, a lifting tool (e.g., a hoist, a jack, or a lift table) must be used to help lift or lower the device.

Currently, a device such as a network switch is typically installed in the following manner. A front bracket and a rear bracket are mounted on the two opposite lateral sides of the device respectively, and then the device is supported, by at least two people or with the help of a tool, at a specific height corresponding to an open rack or a rack-type cabinet. Following that, the front bracket and the rear bracket are locked to the open rack or rack-type cabinet by one person while the device is supported by the other person. If the horizontal position of the device needs adjustment, the assistance of a third person may be required. It can be known from the above that the installation of the device is labor-intensive and may entail a time-consuming operation for positional adjustment.

Accordingly, one of the issues addressed in the present disclosure is saving labor and improving the adjustment adequacy of the installation position, so as to solve the above-referenced technical issues and meet the demand of the industry.

SUMMARY

In view of the inadequacy of the convention technique, in order to meet the demand that the installation of a device having a certain weight can be completed by a single person, and in the meantime improve on the assembling methods of the conventional device bracket assemblies, as a result of repeated research and tests, the present disclosure presents a device bracket assembly that is easily mountable, so as to meet the demands of the industry and solve the conventional issues.

Certain aspects of the present disclosure are directed to an easily mountable device bracket assembly. The easily mountable device bracket assembly includes a first bracket, at least one mounting member, a second bracket and a third bracket. The first bracket can be mounted at a front end of an open rack or a rack-type cabinet. The at least one mounting member can be mounted at a lateral side of the first bracket. A first slide groove is formed by at least one gap formed by the at least one mounting member and the lateral side of the first bracket. The second bracket can be mounted at a rear end of the open rack or the rack-type cabinet, and extend into the first slide groove in a connecting direction so as to be connected with the first bracket. The third bracket can be mounted on a device and be connected to the first bracket slidingly along the connecting direction when the device mounted with the third bracket is placed into the open rack or the rack-type cabinet. The third bracket has a lateral side that can be fixed to a housing of the device, and at least one bent portion having an inner wall spaced apart from an outer wall of the third bracket to form at least one second slide groove. The at least one second slide groove can be in contact with the first bracket when the device mounted with the third bracket is placed into the open rack or the rack-type cabinet. The mountable device bracket assembly allows an easier installation and/or removal of a device on/in an open rack or a rack-type cabinet, and can effectively reduce manpower required.

In certain embodiments, the at least one bent portion is formed at the top side of the third bracket, or includes two bent portions formed respectively at the top side and the bottom side of the third bracket and bent toward each other.

In certain embodiments, the at least one bent portion is extended with at least one guiding member adjacent to an end of the at least one bent portion. Each of a top side and a bottom side of the first bracket that are adjacent to a front end of the first bracket is gradually inclined toward the other one to form at least one first inclined surface. The at least one guiding member can, when the device mounted with the third bracket is placed into the open rack or the rack-type cabinet, be gradually advanced along the at least one first inclined surface, so that the at least one second slide groove is in contact with the first bracket and the third bracket is connected to the first bracket slidingly along the connecting direction.

In certain embodiments, an end of the third bracket is extended with a guiding portion, and the guiding portion can contact another lateral side of the first bracket when the device mounted with the third bracket is placed into the open rack or the rack-type cabinet.

In certain embodiments, the front end of the first bracket is bent outward to form a first fixing portion. The first fixing portion is formed with a plurality of first fixing holes that allow a plurality of fixing members to be passed therethrough respectively to fix the first bracket to a front supporting frame of the open rack or the rack-type cabinet. A rear end of the second bracket is bent outward to form a second fixing portion. The second fixing portion is formed with at least one second fixing hole configured to allow at least one fixing member to be passed therethrough to fix the second bracket to a rear supporting frame of the open rack or the rack-type cabinet. A front end of the third bracket is bent outward to form at least one third fixing portion. The at least one third fixing portion is formed with at least one third fixing hole that allows at least one fixing member to be passed therethrough. The third bracket can be fixed to the front supporting frame of the open rack or the rack-type cabinet by passing the at least one fixing member through the at least one third fixing hole and at least one of the first fixing holes.

In certain embodiments, a bracket handle is formed adjacent to the at least one third fixing portion.

In certain embodiments, the easily mountable device bracket assembly further includes a positioning element that has an elastic portion and a holding portion. The holding portion can be fixed to the lateral side of the first bracket, and the first bracket is formed with a through hole adjacent to the front end thereof. The elastic portion can be exposed from the through hole when the holding portion is fixed to the lateral side of the first bracket.

In certain embodiments, the easily mountable device bracket assembly further includes a magnetic positioning element that has a first magnetic polarity. Another lateral side of the first bracket is concavely formed with a receiving space adjacent to the front end of the first bracket for receiving the magnetic positioning element. An end of the third bracket is formed with the guiding portion, and the guiding portion has a second magnetic polarity opposite to the first magnetic polarity.

In certain embodiments, the front end of the third bracket is bent outward to form at least two third fixing portions vertically spaced apart with a bracket handle formed therebetween.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION

Figure 1:
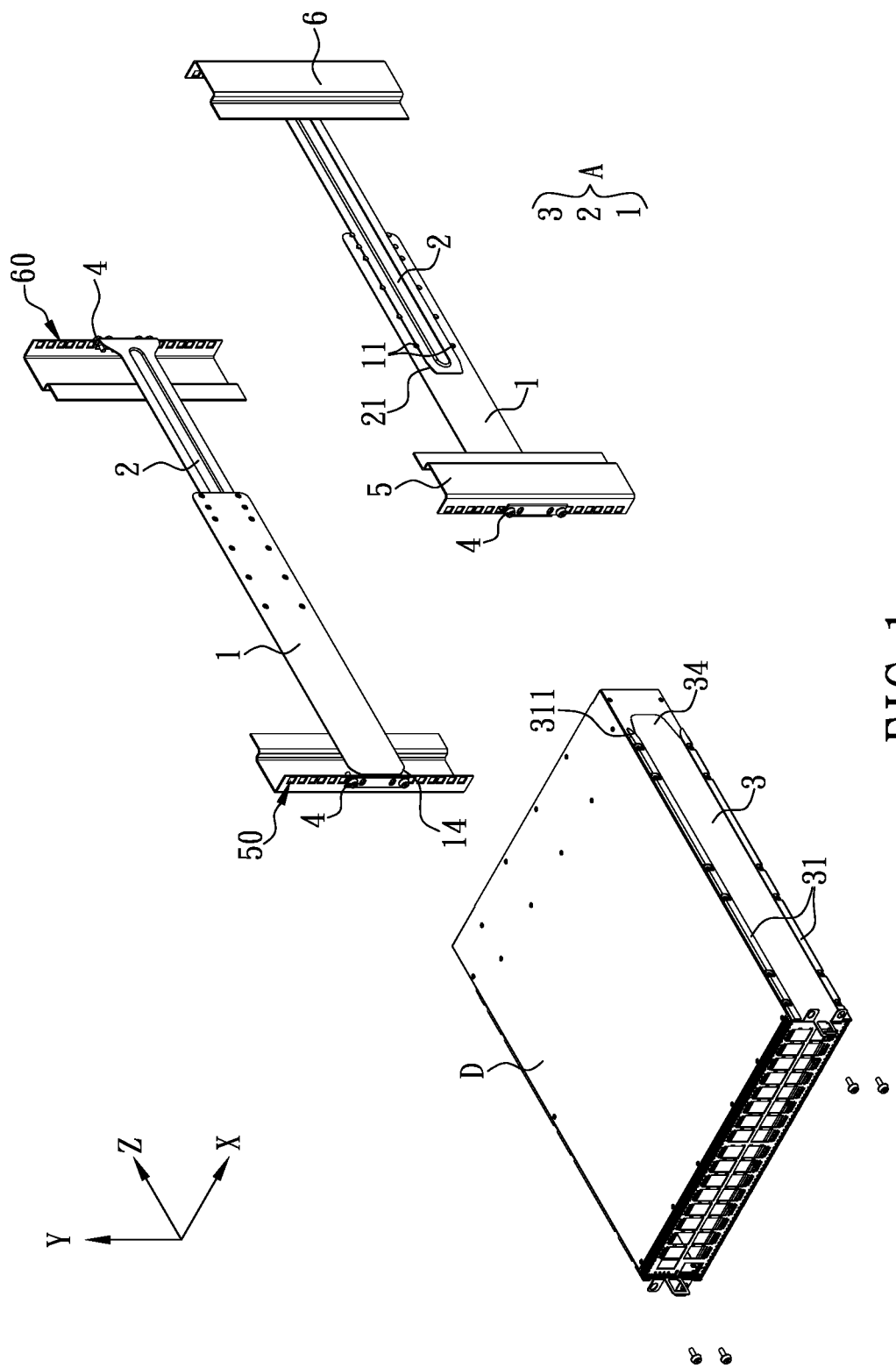
FIG. 1 is a partially assembly view of a device bracket assembly and a device according to certain embodiments of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The accompanying drawings are schematic and may not have been drawn to scale. The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, materials, objects, or the like, which are for distinguishing one component/material/object from another one only, and are not intended to, nor should be construed to impose any substantive limitations on the components, materials, objects, or the like. Directional terms (e.g., "front", "rear", "left", "right", "upper/top" and/or "lower/bottom") are explanatory only and are not intended to be restrictive of the scope of the present disclosure.

Figure 2:
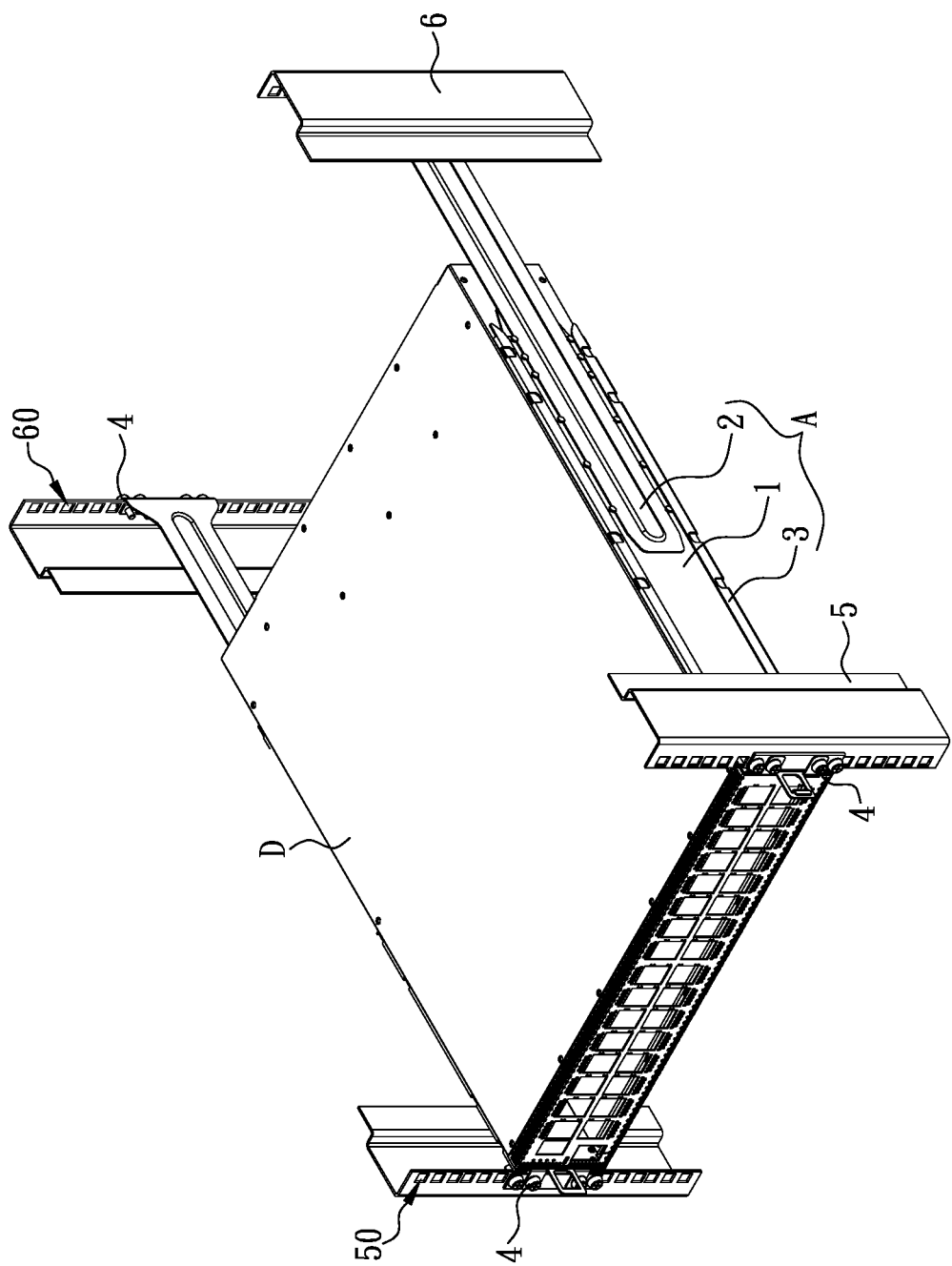
FIG. 2 is an assembly view of a device bracket assembly and a device according to certain embodiments of the present disclosure.
Figure 3:
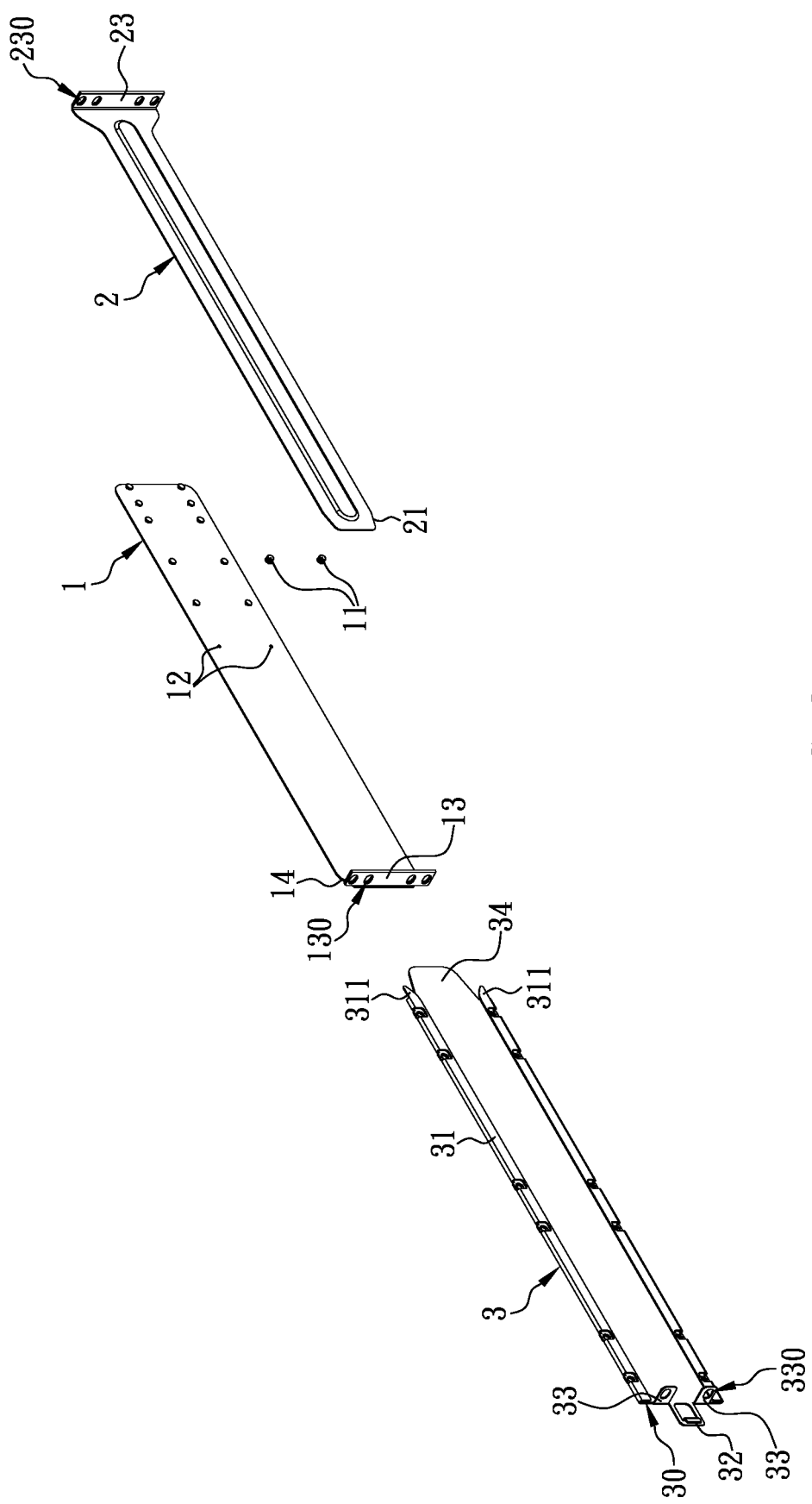
FIG. 3 is an exploded view of a device bracket assembly according to certain embodiments of the present disclosure.

Certain aspects of the present disclosure are directed to a bracket assembly that is easily mountable to a device. Referring to FIGS. 1-3, in certain embodiments, the device bracket assembly A includes a first bracket 1, a second bracket 2, and a third bracket 3, and can be made of a metal material, such as being made of sheet metal. To facilitate description of the relative positions of the various elements, the front side of each element is defined as facing the lower left corner of FIG. 1, the rear side as facing the upper right corner of FIG. 1, the left side as facing the upper left corner of FIG. 1, the right side as facing the lower right corner of FIG. 1, the upper side (e.g., the top side) as facing the top edge of FIG. 1, and the lower side (e.g., the bottom side) as facing the bottom edge of FIG. 1. The X-direction axis as referred to infra refers to a direction that can extend, for example, horizontally in the left-right direction, the Y-direction axis as referred to infra refers to a direction that can extend, for example, in the top-bottom direction, and the Z-direction axis as referred to infra refers to a direction that can extend, for example, horizontally in the front-rear direction. The configuration of the device bracket assembly A is not limited to that shown in FIGS. 1-8, and a manufacturer may adjust the configuration of any element of the device bracket assembly A based on product requirements. As long as such a bracket assembly has the basis structure and functions of the device bracket assembly A disclosed in the present disclosure, it falls within the definition of the device bracket assembly A according to the present disclosure.

With continued reference to FIG. 1 to FIG. 3, the first bracket 1 is configured to be mounted at the front end of an open rack or a rack-type cabinet. The outer side of the first bracket 1 can be mounted with six mounting members 11 (e.g., pins or screws) at a first position adjacent to the top side of the first bracket 1, and be mounted with another six mounting members 11 at a second position closer to the bottom side of the first bracket 1 than the first position. The first bracket 1 has mounting portions 12 corresponding respectively in position to the mounting members 11. When the mounting members 11 are mounted in the corresponding mounting portions 12, each of the mounting members 11 and the outer side of the first bracket 1 form a gap, and the gaps form a first slide groove 10. The front end of the first bracket 1 is bent outward to form a first fixing portion 13, and the first fixing portion 13 is formed with four first fixing holes 130 so that a plurality of fixing members 4 can be passed through the first fixing holes 130 respectively to fix the first bracket 1 to a front supporting frame 5 of the open rack or rack-type cabinet. A portion of the top side of the first bracket 1 that is adjacent to the first fixing portion 13 and a portion of the bottom side of the first bracket 1 that is adjacent to the first fixing portion 13 are gradually inclined toward each other to form two first inclined surfaces 14 respectively. The first inclined surfaces 14 are configured for making positional adjustment in the Y-axis direction so that a device D (e.g., a switch, a 2U network switch, or a server) can be slid into the open rack or rack-type cabinet with higher precision.

The second bracket 2 is configured to be mounted at the rear end of the open rack or rack-type cabinet. A portion of the top side of the second bracket 2 that is adjacent to the front end and a portion of the bottom side of the second bracket 2 that is adjacent to the front end are gradually inclined along the Y-axis direction toward each other to form two second inclined surfaces 21 respectively. The rear end of the second bracket 2 is bent outward to form a second fixing portion 23, and the second fixing portion 23 is formed with four second fixing holes 230 so that four fixing members 4 can be passed through the second fixing holes 230 respectively to fix the second bracket 2 to a rear supporting frame 6 of the open rack or rack-type cabinet. In the course in which the second bracket 2 and the first bracket 1 are connected to each other, the second bracket 2 extends into the first slide grooves 10 (see FIG. 4) in a connecting direction (i.e., the Z-axis direction) such that the second bracket 2 and the first bracket 1 enter a connected relationship that allows the two brackets to slide with respect to each other. If the second bracket 2 is connected to the first bracket 1 in such a way that the second bracket 2 is slightly tilted in the vertical direction, one of the second inclined surfaces 21 can contact the mounting member(s) 11 adjacent to the top or bottom side of the first bracket 1 and thereby guide the second bracket 2 into the first slide groove 10, in order for the second bracket 2 to be connected to the first bracket 1 smoothly. Moreover, the forward and rearward extension lengths and overlapped area of the second bracket 2 and the first bracket 1 are not limited to those shown in the drawings and can be adjusted according to the front-to-rear length of the device D or the depth of the open rack or rack-type cabinet.

The inner side of the third bracket 3 is configured to be fixed to one of the outer sides of the housing of the device D. The top side and the bottom side of the third bracket 3 are bent toward each other to form, for example but not limited to, two bent portions 31 respectively. The inner wall of each bent portion 31 is spaced apart from the outer wall of the third bracket 3 such that a second slide groove 30 is formed between the inner wall of each bent portion 31 and the outer wall of the third bracket 3. The front end of the third bracket 3 is bent outward to form two third fixing portions 33. The two third fixing portions 33 are vertically spaced apart, with a bracket handle 32 formed between the third fixing portions 33. Each third fixing portion 33 is formed with a third fixing hole 330 so that two fixing members 4 can be passed through the third fixing holes 330 respectively to fix the third bracket 3 to the front supporting frame 5 of the open rack or rack-type cabinet. Each bent portion 31 is extended with a guiding member 311 adjacent to the rear end of the bent portion 31, and the rear end of the third bracket 3 is further extended with a guiding portion 34. In the course in which the device D mounted with the third bracket 3 is placed into the open rack or rack-type cabinet, the guiding portion 34 contacts the inner side of the first bracket 1, and then the guiding members 311 are gradually advanced along the first inclined surfaces 14 respectively to allow positional adjustment of the third bracket 3 in the Y-axis direction.

Once the walls of the second slide grooves 30 are in contact with the first bracket 1, a user can make the first bracket 1 enter the second slide grooves 30 (see FIG. 4) in a relatively effortless manner by holding the bracket handle 32 to prevent the device D from falling, and the third bracket 3 is accordingly connected to the first bracket 1 slidingly along the connecting direction (i.e., the Z-axis direction). In certain embodiments, only the top side of the third bracket 3 is bent to form a bent portion 31, and as long as the third bracket 3 can be connected to the first bracket 1 slidingly along the Z-axis direction, the bottom side of the third bracket 3 is not limited to be provided with a bent portion 31. In certain embodiments, the front end of the third bracket 3 can be formed with one third fixing portion 33 only, or with at least three third fixing portions 33. In cases where the front end of the third bracket 3 is formed with only one third fixing portion 33, the bracket handle 32 is formed adjacent to the third fixing portion 33. In cases where the front end of the third bracket 3 is formed with at least three third fixing portions 33 and at least two bracket handles 32, the bracket handles 32 can alternate with the third fixing portions 33, i.e., with one bracket handle 32 between each two adjacent third fixing portions 33 to facilitate holding by a user; or the bracket handles 32 can be arranged adjacent to each other. The number of the third fixing portions 33 and the number of the bracket handles 32 can be adjusted according to product requirements.

Figure 4:
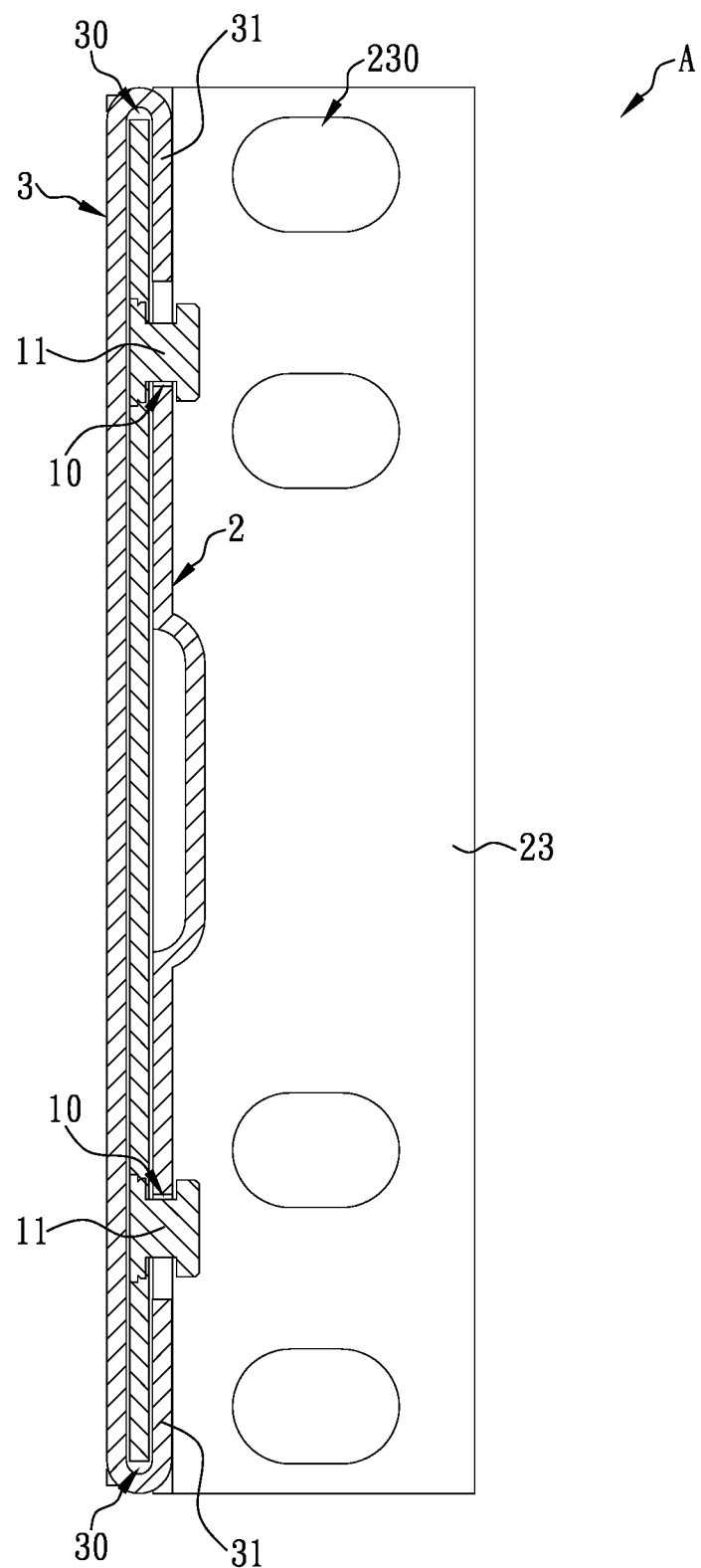
FIG. 4 is a longitudinal cross-sectional view of a device bracket assembly according to certain embodiments of the present disclosure.

In certain embodiments, referring to FIG. 2 to FIG. 4, the open rack or the rack-type cabinet (not shown) has two front supporting frames 5 and two rear supporting frames 6, and the front supporting frame 5 and the rear supporting frame 6 on the left are mounted with a device bracket assembly A, and so are the front supporting frame 5 on the right and the rear supporting frame 6 on the right. The mounting process of the device bracket assemblies A will be described below with reference to the device bracket assembly A, the front supporting frame 5, and the rear supporting frame 6 on the same side (e.g., the left or right side). The device bracket assembly A, the front supporting frame 5, and the rear supporting frame 6 on the other side have the same elements and functions and therefore will not be described repeatedly.

Referring to FIGS. 1-4 and 8, the first fixing portion 13 can be placed against the front side of the front supporting frame 5 and expose the corresponding front supporting frame fixing holes 50. Next, two fixing members 4 can be passed through the first fixing holes 130 respectively adjacent to the top end and the bottom end of the first fixing portion 13 and then through the corresponding front supporting frame fixing holes 50 respectively in a tentatively fixing (e.g., preliminarily locking) manner, thereby mounting the first bracket 1 on the front supporting frame 5. The second bracket 2 can then be inserted into the first slide groove 10 until the second fixing portion 23 abuts against the rear side of the rear supporting frame 6 and exposes the corresponding rear supporting frame fixing holes 60. Four fixing members 4 are then passed through the second fixing holes 230 and the corresponding rear supporting frame fixing holes 60 respectively in a tentatively fixing (e.g., preliminarily locking) manner to mount the second bracket 2 on the rear supporting frame 6. Afterward, the device D mounted with the third bracket 3 is placed into the open rack or rack-type cabinet in the Z-axis direction. During the process, the guiding portion 34 contacts the inner side of the first bracket 1, and then the guiding members 311 are gradually advanced along the first inclined surfaces 14 respectively. As a result, the walls of the second slide grooves 30 of the third bracket 3 are brought into contact with the first bracket 1 along the contours of the first inclined surfaces 14 respectively. A user can then push the device D) completely into the open rack or rack-type cabinet in the Z-axis direction by holding the bracket handle 32, in order for the first bracket 1 to extend into the second slide grooves 30, and therefore for the device D to be mounted on the first bracket 1 via the third bracket 3. And then, two fixing members 4 are passed through the third fixing holes 330, the corresponding first fixing holes 130, and the corresponding front supporting frame fixing holes 50 respectively, and all the fixing members 4 are tightened completely, thereby completing the mounting of the device bracket assembly A.

In certain embodiments, the mounting process of the first bracket 1 and the second bracket 2 can be adjusted as follows if a lack of extra space behind the open rack or rack-type cabinet (i.e., behind the rear supporting frame 6) makes it difficult or impossible to mount the second bracket 2 in the way described above. First, the second bracket 2 is mounted on the rear supporting frame 6 and is completely fixed with the required number of fixing members 4. Next, the wall of the first slide groove 10 are brought into contact with the second bracket 2, and the first bracket 1 is moved along the second bracket 2 until the first fixing portion 13 abuts against the front supporting frame 5. The first fixing portion 13 is then preliminarily locked with the required number of fixing members 4 to complete the mounting of the first bracket 1 and the second bracket 2. When it is desired to remove the device D from the open rack or rack-type cabinet, a user can achieve this simply by removing the fixing members 4 that are locked into the third fixing holes 330 respectively, holding the bracket handle 32, and then pulling the device D out in the Z-axis direction.

Figure 5:
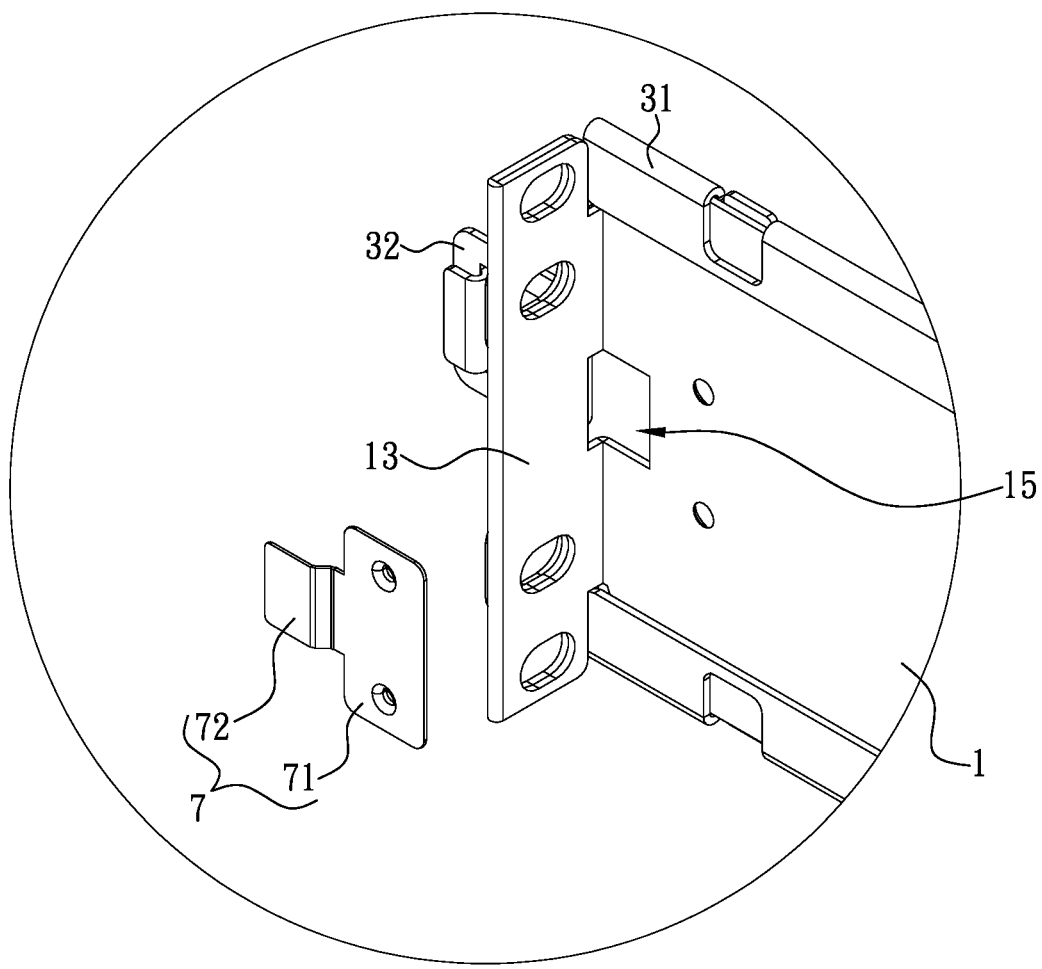
FIG. 5 is a partially exploded view of a portion of a device bracket assembly according to certain embodiments of the present disclosure.
Figure 6:
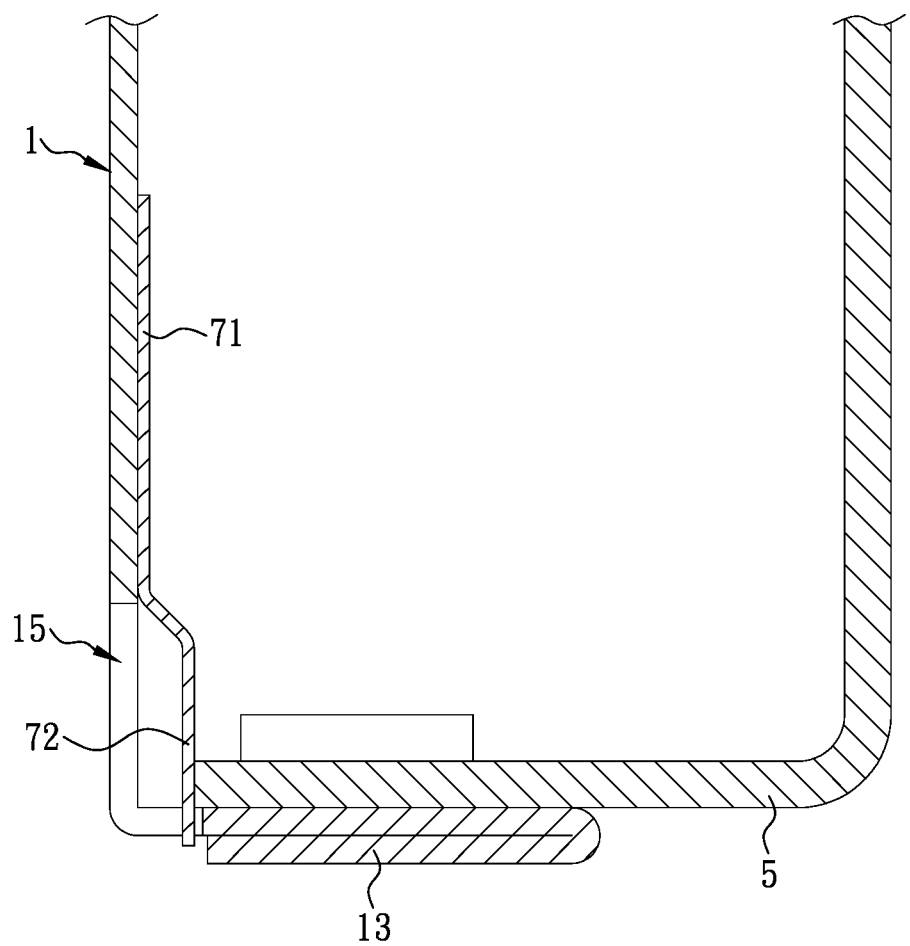
FIG. 6 is a transversal cross-sectional view of a first bracket, a positioning element and a front supporting frame that shows the relative positions thereof according to certain embodiments of the present disclosure.
Figure 7:
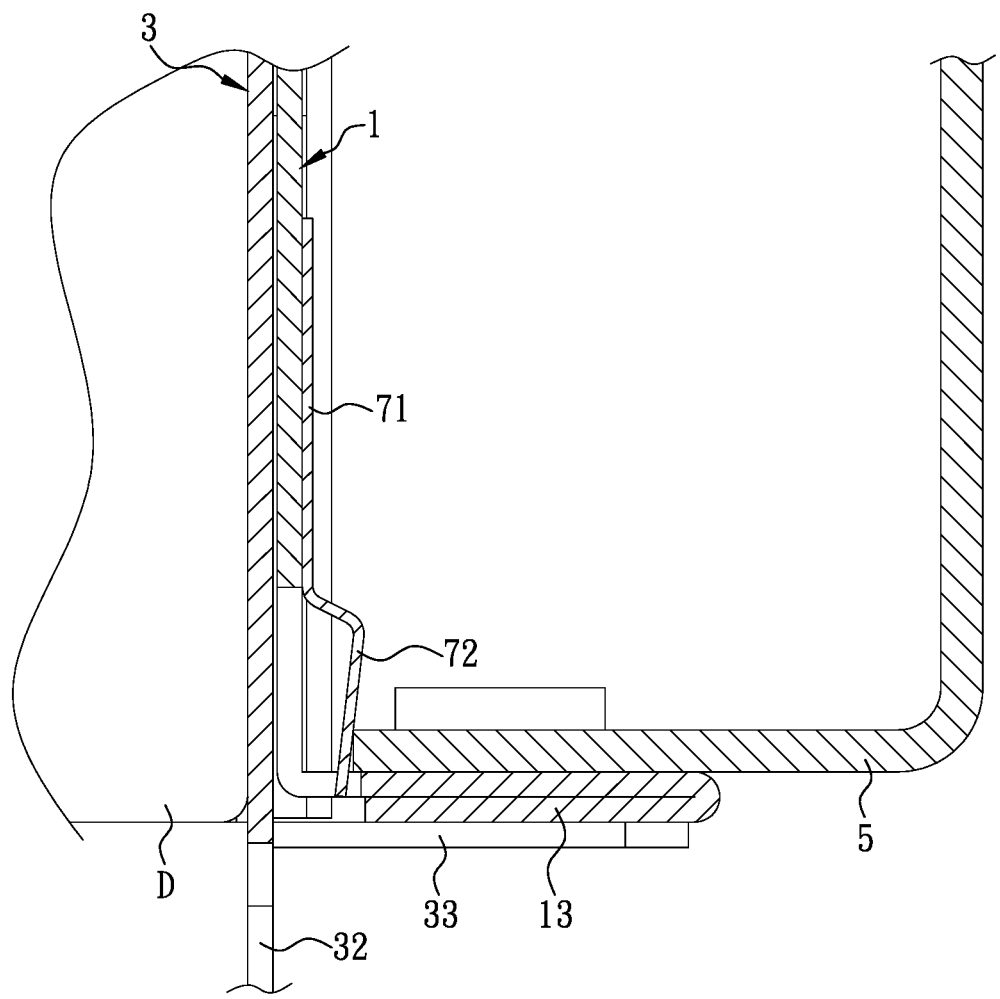
FIG. 7 is a transversal cross-sectional view of a device mounted with a third bracket and a positioning element that shows the relative positions thereof according to certain embodiments of the present disclosure.

Referring to FIG. 5 to FIG. 7, in certain embodiments, the first bracket 1 can be formed with a through hole 15 adjacent to the front end, and the outer side of the first bracket 1 can be mounted with a positioning element 7. The positioning element 7 includes a holding portion 71 and an elastic portion 72, which can be an elastic plate. The holding portion 71 can be fixed on the outer side of the first bracket 1 in such a way that the front end of the elastic portion 72 is exposed through the through hole 15. When the device D mounted with the third bracket 3 is placed into the open rack or rack-type cabinet, as shown in FIG. 7, the first bracket 1 applies a pushing force to the positioning element 7 in the X-axis direction and thereby deflects the positioning element 7. The elastic portion 72 of the positioning element 7 is therefore pressed against the front supporting frame 5, which in turn applies a reaction force to the first bracket 1, and the reaction force will push the first bracket 1 even more tightly against the third bracket 3 and thus produce an adjusting effect on the position of the third bracket 3 and the device D in the X-axis direction.

Then, the guiding portion 34 can be brought into contact with the inner side of the first bracket 1, and the guiding members 311 are gradually advanced along the first inclined surfaces 14 respectively (as shown in FIG. 1) to enable positional adjustment in the Y-axis direction. The foregoing positional adjustment mechanisms allow the device D and the third bracket 3 to advance more precisely along the Z-axis direction and connect with the first bracket 1 slidingly.

Figure 8:
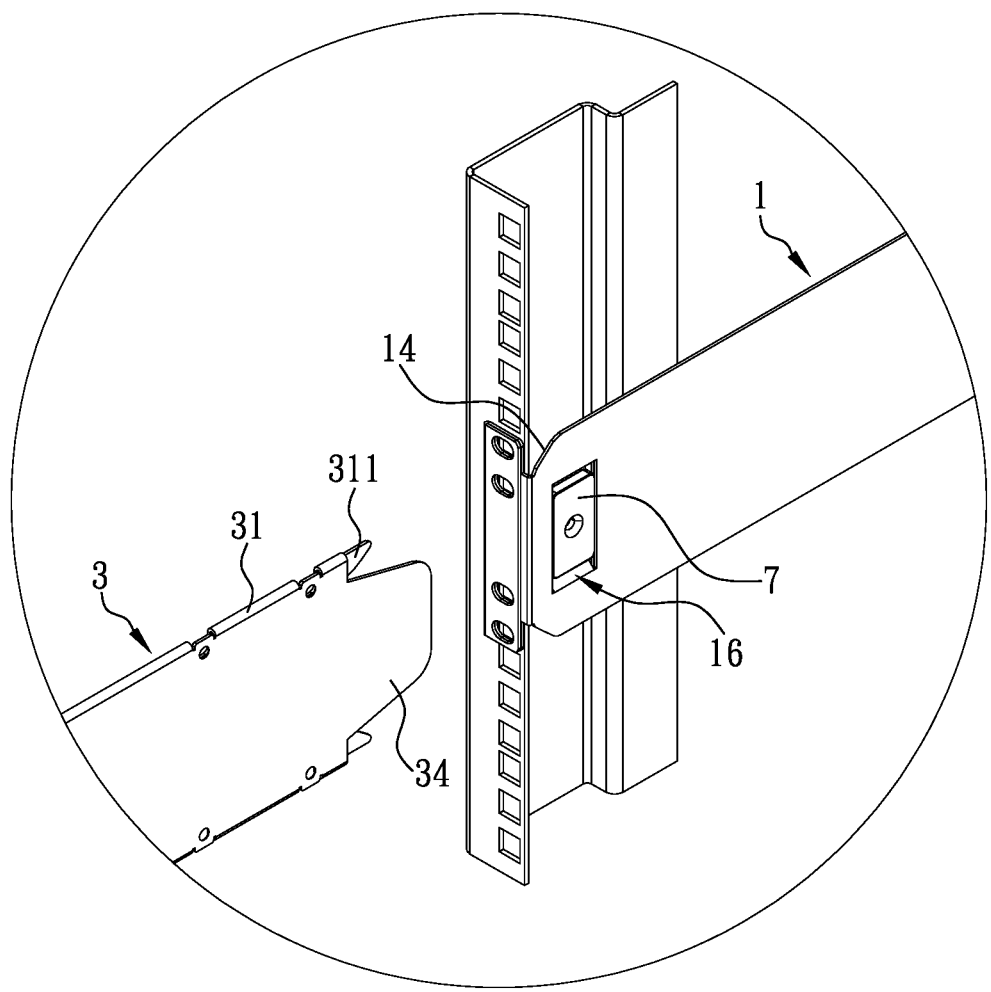
FIG. 8 is a partially exploded view of a portion of a device bracket assembly according to certain embodiments of the present disclosure.

In certain embodiments, referring to FIG. 8, the inner side of the first bracket 1 is concavely formed with a receiving space 16 adjacent to the front end, and a positioning element 7 can be mounted in the receiving space 16, wherein the positioning element 7 is a magnetic element (e.g., a magnet with an N pole). In addition, the guiding portion 34 extending from the rear end of the third bracket 3 can have a magnetic polarity (e.g., an S pole) opposite to that of the positioning element 7. When the device D mounted with the third bracket 3 is placed into the open rack or rack-type cabinet, the guiding portion 34 contacts the inner side of the first bracket 1 such that magnetic attraction takes place between the guiding portion 34 and the positioning element 7. The resulting magnetic force brings the third bracket 3 into close contact with the first bracket 1 and thereby produces an adjusting effect on the position of the third bracket 3 and the device D in the X-axis direction. Afterwards, the guiding members 311 contact the first inclined surfaces 14 respectively to enable positional adjustment in the Y-axis direction. The foregoing positional adjustment mechanisms allow the device D and the third bracket 3 to advance more precisely along the Z-axis direction and connect with the first bracket 1 slidingly.

According to the above, the device bracket assembly A according to the present disclosure allows the device D, which may be a 2U network switch weighing 21.5 kg, to be easily mounted on/in and/or removed from an open rack or a rack-type cabinet. The guiding portion 34, the guiding members 311, and the positioning element 7 are so designed that the device D mounted with the third bracket 3 can be guided into precise alignment with the front end of the first bracket 1 and then placed into the open rack or rack-type cabinet smoothly, solving the issues of having to adjust/fine-tune the slide-in angle manually and repeatedly, making it possible for a single person to carry out installation and/or removal of the device D. The manpower required for the installation is therefore reduced, and a lifting tool for providing assistance in lifting or lowering the device D can be dispensed with.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A mountable device bracket assembly, comprising:
 a first bracket configured to be mounted at a front end of an open rack or a rack-type cabinet;
 at least one mounting member configured to be mounted at a lateral side of the first bracket, wherein a first slide groove is formed by at least one gap formed by the at least one mounting member and the lateral side of the first bracket;

a second bracket configured to be mounted at a rear end of the open rack or the rack-type cabinet, and extend into the first slide groove in a connecting direction to be connected with the first bracket;

a third bracket configured to be mounted on a device and connected to the first bracket slidingly along the connecting direction when the device mounted with the third bracket is placed into the open rack or the rack-type cabinet, and having a lateral side configured to be fixed to a housing of the device and at least one bent portion having an inner wall spaced apart from an outer wall of the third bracket to form at least one second slide groove, wherein the at least one second slide groove is configured to be in contact with the first bracket when the device mounted with the third bracket is placed into the open rack or the rack-type cabinet; and a magnetic positioning element having a first magnetic polarity, wherein another lateral side of the first bracket is concavely formed with a receiving space adjacent to a front end of the first bracket for receiving the magnetic positioning element, an end of the third bracket is formed with a guiding portion, and the guiding portion has a second magnetic polarity opposite to the first magnetic polarity.

2. The mountable device bracket assembly according to claim 1, wherein the at least one bent portion is formed at a top side of the third bracket, or comprises two bent portions formed respectively at the top side and a bottom side of the third bracket and bent toward each other.

3. The mountable device bracket assembly according to claim 1, wherein the at least one bent portion is extended with at least one guiding member adjacent to an end of the at least one bent portion, each of a top side and a bottom side of the first bracket that are adjacent to the front end of the first bracket is gradually inclined toward the other one to form at least one first inclined surface, wherein the at least one guiding member is configured to, when the device mounted with the third bracket is placed into the open rack or the rack-type cabinet, be gradually advanced along the at least one first inclined surface, so that the at least one second slide groove is in contact with the first bracket and the third bracket is connected to the first bracket slidingly along the connecting direction.

4. The mountable device bracket assembly according to claim 1, wherein the front end of the first bracket is bent outward to form a first fixing portion, the first fixing portion is formed with a plurality of first fixing holes configured to allow a plurality of fixing members to be passed therethrough respectively to fix the first bracket to a front supporting frame of the open rack or the rack-type cabinet, a rear end of the second bracket is bent outward to form a second fixing portion, the second fixing portion is formed with at least one second fixing hole configured to allow at least one fixing member to be passed therethrough to fix the second bracket to a rear supporting frame of the open rack or the rack-type cabinet, a front end of the third bracket is bent outward to form at least one third fixing portion, the at least one third fixing portion is formed with at least one third fixing hole configured to allow at least one fixing member to be passed therethrough, and the third bracket is configured to be fixed to the front supporting frame of the open rack or the rack-type cabinet by passing the at least one fixing member through the at least one third fixing hole and at least one of the first fixing holes.

5. The mountable device bracket assembly according to claim 4, wherein a bracket handle is formed adjacent to the at least one third fixing portion.

6. The mountable device bracket assembly according to claim 1, wherein the guiding portion is configured to contact the another lateral side of the first bracket when the device mounted with the third bracket is placed into the open rack or the rack-type cabinet.

7. The mountable device bracket assembly according to claim 1, further comprising a positioning element comprising an elastic portion and a holding portion configured to be fixed to the lateral side of the first bracket, wherein the first bracket is formed with a through hole adjacent to the front end thereof, and the elastic portion is configured to be exposed from the through hole when the holding portion is fixed to the lateral side of the first bracket.

8. The mountable device bracket assembly according to claim 1, wherein a front end of the third bracket is bent outward to form at least two third fixing portions vertically spaced apart with a bracket handle formed therebetween.

9. A mountable device bracket assembly, comprising:

a first bracket configured to be mounted at a front end of an open rack or a rack-type cabinet;

at least one mounting member configured to be mounted at a lateral side of the first bracket, wherein a first slide groove is formed by at least one gap formed by the at least one mounting member and the lateral side of the first bracket;

a second bracket configured to be mounted at a rear end of the open rack or the rack-type cabinet, and extend into the first slide groove in a connecting direction to be connected with the first bracket; and a third bracket configured to be mounted on a device and connected to the first bracket slidingly along the connecting direction when the device mounted with the third bracket is placed into the open rack or the rack-type cabinet, and having a lateral side configured to be fixed to a housing of the device and at least one bent portion having an inner wall spaced apart from an outer wall of the third bracket to form at least one second slide groove, wherein the at least one second slide groove is configured to be in contact with the first bracket when the device mounted with the third bracket is placed into the open rack or the rack-type cabinet, wherein the at least one bent portion is extended with at least one guiding member adjacent to an end of the at least one bent portion, each of a top side and a bottom side of the first bracket that are adjacent to a front end of the first bracket is gradually inclined toward the other one to form at least one first inclined surface, wherein the at least one guiding member is configured to, when the device mounted with the third bracket is placed into the open rack or the rack-type cabinet, be gradually advanced along the at least one first inclined surface, so that the at least one second slide groove is in contact with the first bracket and the third bracket is connected to the first bracket slidingly along the connecting direction.

* * * * *